United States Patent [19]

Vitaliev et al.

[11] 4,077,029
[45] Feb. 28, 1978

[54] ASSOCIATIVE MEMORY

[76] Inventors: Georgy Viktorovich Vitaliev, ulitsa Vavilova, 39, kv. 17, Moscow; Alexei Davidovich Gvinepadze, Ljubertsy, ulitsa Lva Tolstogo, 27, kv. 8, Moskovskaya oblast; Rem Vasilievich Smirnov, 3 mikroraion Teplogo Stana, korpus 32, kv. 36; Gury Dmitrievich Sofiisky, ulitsa Kazakova, 18, kv. 67, both of Moscow, all of U.S.S.R.

[21] Appl. No.: 657,063

[22] Filed: Feb. 11, 1976

[30] Foreign Application Priority Data

Feb. 13, 1975  U.S.S.R. ............................ 2104774

[51] Int. Cl.² .................... G11C 15/00; G11C 8/00
[52] U.S. Cl. ............................................. 365/49
[58] Field of Search ............................ 340/173 AM

[56] References Cited

U.S. PATENT DOCUMENTS

| | | | |
|---|---|---|---|
| 3,402,398 | 9/1968 | Koerner et al. | 340/173 AM |
| 3,643,236 | 2/1972 | Kolankowsky | 340/173 AM |
| 3,644,906 | 2/1972 | Weinberger | 340/173 AM |
| 3,890,603 | 6/1975 | Jones et al. | 340/173 AM |
| 3,913,075 | 10/1975 | Vitaliev et al. | 340/173 AM |

Primary Examiner—Stuart N. Hecker
Attorney, Agent, or Firm—Lackenbach, Lilling & Siegel

[57] ABSTRACT

An associative memory includes storage units each of which includes an address storage module and an interrogation decoder connected thereto by address buses; an interrogation register having flip-flops connected to the inputs of respective interrogation decoders; detectors connected to the storage units by digit buses; a complementary interrogation decoder to drive respective detectors; a complementary interrogation register to receive and store the complementary interrogation code represented by a complementary given set of binary descriptors, the register comprising a given number of flip-flops connected to respective inputs of the complementary interrogation decoder and to the complementary inputs of the interrogation decoders of the storage units, while the outputs of the complementary interrogation decoder are connected to the complementary inputs of the respective detectors.

7 Claims, 3 Drawing Figures

ASSOCIATIVE MEMORY

The present invention relates to memory devices and, in particular, to associative memories.

It may be used to perform retrieval operations on data files.

The advances in modern computer technology made it imperative to design memory devices able to store data files and to perform parallel retrieval of data therefrom in accordance with descriptors, which form a part of the basic data file, in contrast to standard (addressed) memories, where a required data bit is retrieved from the file in accordance with the identifying number (address) thereof. The advances in microelectronics facilitated the development of such devices. The performance characteristics of special associative integrated storage modules in general and their low data capacity in particular caused by the complexity of their storage organization, do not, however, meet the present requirements of the computer technology. Hence, it is feasible that associative memories in certain cases should be designed with the use of address integrated storage modules. Thus, it becomes possible to increase their data capacity since the capacity of the available address storage modules exceeds that of special associative storage modules by one or two orders of magnitude.

There are known in the prior art associative memories using non-associative storage devices. Such memories comprise storage units arranged in a matrix. Every unit comprises an address storage module having address and digit buses; an interrogation decoder, its outputs being connected to respective address buses of the address storage module; an interrogation register comprising flip-flops which are divided into groups in accordance with the number of lines in the storage unit matrix and the outputs of which are connected to the inputs of respective interrogation decoders, and detectors the inputs of which are connected to the digit buses of storage units in the respective matrix column.

Retrieval operations in these associative memories are performed on descriptor data represented by multibit associative words and stored in storage units, forming a matrix for parallel retrievel operations on descriptor data. The search criterion in this case is the coincidence of associative word codes with the interrogation code which is stored in an interrogation register and converted into a code to interrogate address storage modules with the help of interrogation decoders. The function of indicating that such a coincidence has been achieved is performed by respective detectors.

The capacity of the associative memories known in the art is, however, increased through the use of codes having a constant number of "units" and "zeros", provided the capacity of address storage modules remains unchanged. This method of storage capacity increase leads to a complex and bulky equipment for interrogation converters when compared with standard interrogation decoders.

The object of the present invention is to provide a method of increasing the capacity of an associative memory without raising the capacity of address storage modules.

Another object of the present invention is to bring down the cost per bit of data storage and processing equipment.

These objects are achieved by providing an associative memory to perform retrieval operations on descriptor data presented as multibit associative words or sets of given quantities of binary associative descriptors which comprises storage units forming a matrix to perform parallel retrieval operations on descriptor data, every unit comprising an address storage module to record, store and access descriptor data stored therein having address and digit buses and an interrogation decoder to excite the address buses of an address storage module, its outputs being connected to respective address buses; an interrogation register to receive and store the interrogation code represented by a given set of binary descriptors having flip-flops the number of which corresponds to that of the binary descriptors in the interrogation code, the flip-flops being divided into groups in accordance with the number of lines in the storage unit matrix and having their outputs connected to the inputs of respective interrogation decoders; detectors to indicate the positions of data with the given set of binary descriptors, their inputs being connected to the digit buses of the storage units in the respective matrix column and which, according to the invention, comprises also a complementary interrogation decoder to drive the respective detector; a complementary interrogation register to receive and store the complementary interrogation code represented by a complementary given set of binary descriptors, the register comprising a given number of flip-flops, the outputs of which are connected to the respective inputs of the complementary interrogation decoder and to the complementary inputs of the interrogation decoders of all the storage units while the outputs of the complementary interrogation decoder are connected to the complementary inputs of the respective detectors, the number thereof being equal to that of the digit buses of all the storage units in one matrix line times the number of the outputs of the complementary interrogation decoder.

The present invention makes it possible to improve the performance characteristics of associative memory devices and in particular to drastically increase their capacity while keeping their total costs practically at the same level.

Other objects and advantages of the present invention will become apparent from the following description of a version of its embodiment taken together with the accompanying drawings, wherein.

Figure 1:
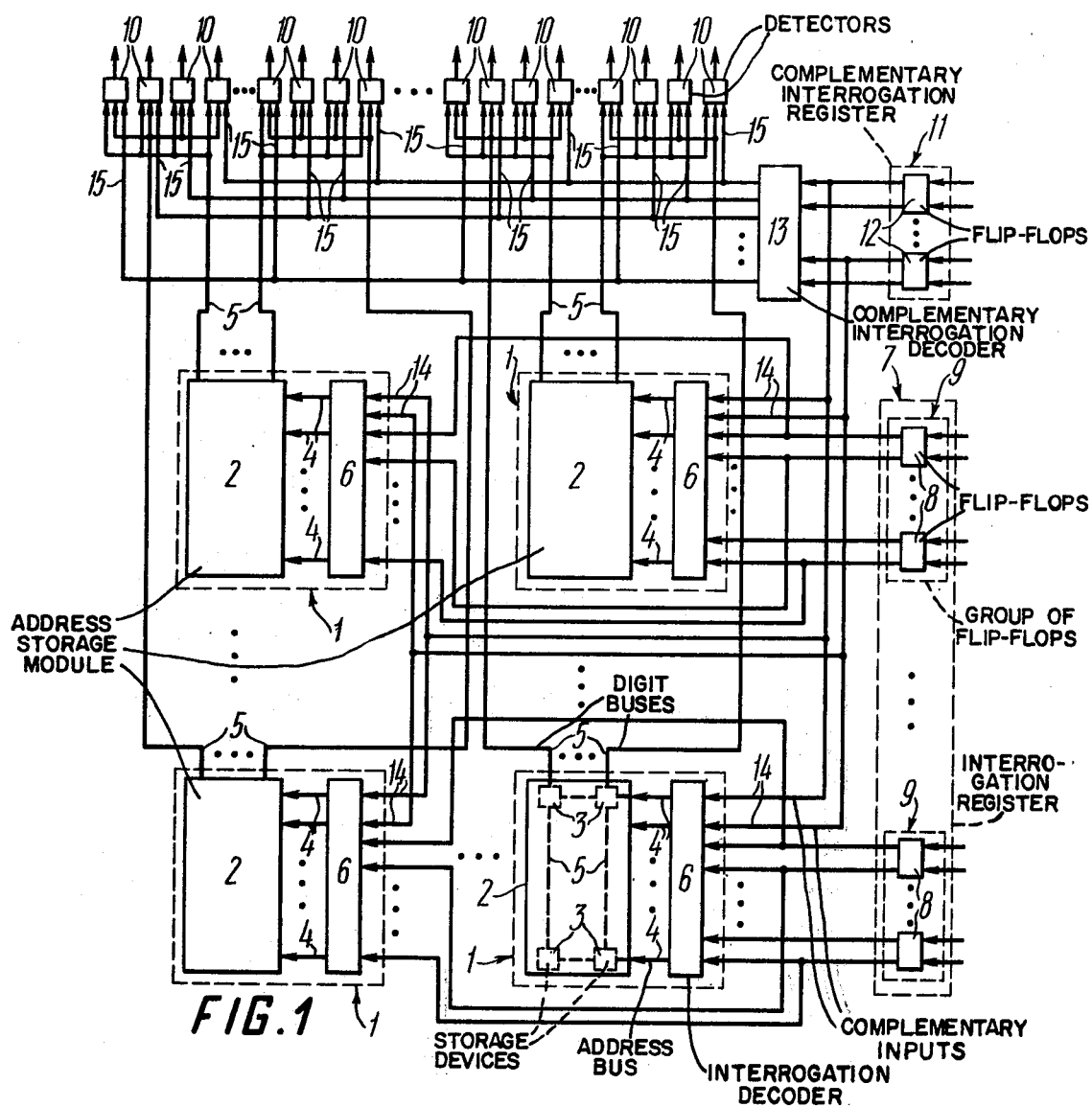
FIG. 1 is a block diagram of a memory, according to the invention.

An associative memory to perform retrieval operations on descriptor data represented by multibit associative words or by sets of a given number of binary associative descriptors includes storage units 1 (FIG. 1) which form a matrix to perform parallel retrieval operations on descriptor data. Every storage unit comprises an address storage module 2 to record, store and access descriptor data stored therein. A storage module is made of storage devices 3 connected to its address buses 4 and digit buses 5. Every storage unit 1 also includes an interrogation decoder 6 to drive the address buses 4 of the address storage module 2 of a given unit. The functions of the units 1 are performed by microcircuits described, for instance, in the U.S. Pat. No. 3,611,318, class 340-173. The memory also comprises an interrogation register 7 to receive and store the interrogation code represented by a given set of binary descriptors. The register contains flip-flops 8, the number of which is equal to that of the binary descriptors in the interrogation code. The flip-flops are divided into $m$ groups 9, $m$ being equal to the number of lines in the matrix of the storage units 1. The outputs of flip-flops are connected to the inputs of the respective decoders 6. The number of flip-flops 8 in every group 9 is $k$. Detectors 10 which serve to indicate the positions of data having the given set of binary descriptors are arranged as coincidence circuits every input of which is connected to the respective bus 5 of the storage unit 1 in one of the matrix column. According to the invention the memory also comprises a complementary interrogation register 11 to receive and store the complementary interrogation code represented by a complementary given set of binary descriptors. The register 11 consists of $l$ flip-flops 12, the outputs of which are connected to respective inputs of a complementary interrogation decoder 13 to drive the corresponding detector 10. Besides, the outputs of the flip-flops 12, which also serve as outputs of the interrogation register 11, are connected to the complementary inputs 14 of the decoders 6 in all the storage units 1. The complementary interrogation decoder 13 is provided with $2^l$ outputs everyone of which is connected to a complementary input 15 of the respective detector 10.

The number of the detectors 10 is equal to that of the digit buses 5 of all the storage units 1 in one matrix line times the number of the outputs of the complementary interrogation decoder 13.

Figure 2:
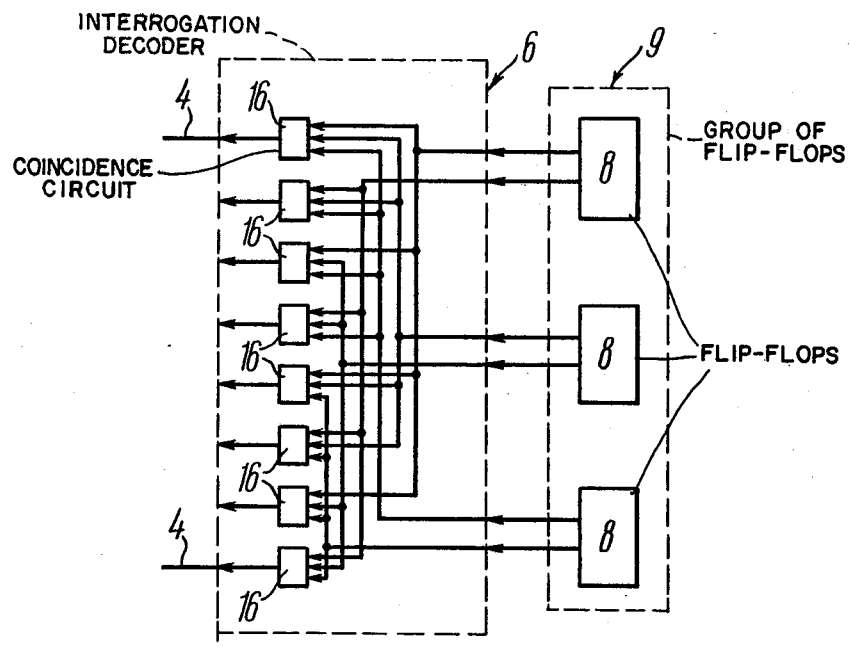
FIG. 2 is a functional diagram of an embodiment of an interrogation decoder of one of the storage units of FIG. 1, according to the invention.

FIG. 2 presents a specific embodiment of the interrogation decoder 6 using coincidence circuits 16, in which the number of the flip-flops 8 in the respective group 9 of the interogation register 7 is equal to three.

Figure 3:
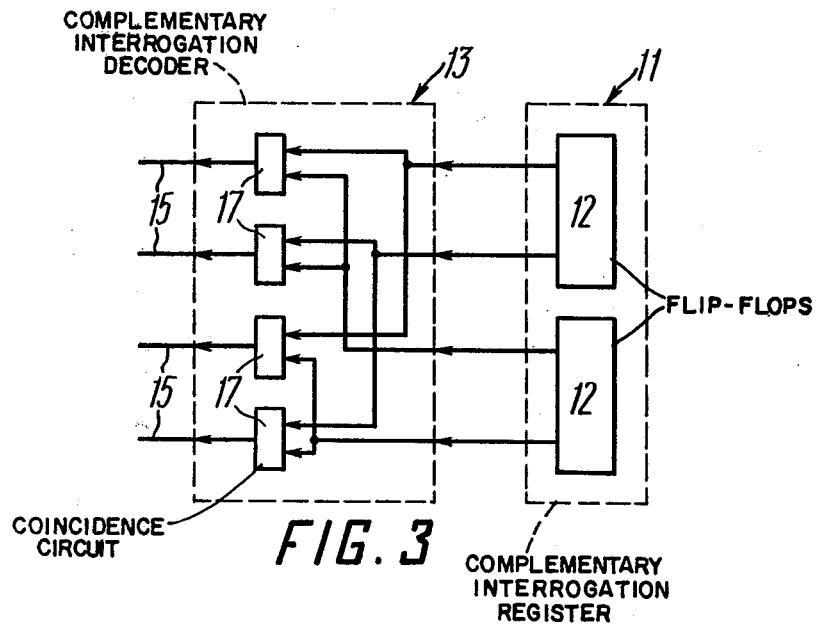
FIG. 3 is a functional diagram of an embodiment of the complementary interrogation decoder of FIG. 1, according to the invention.

FIG. 3 presents a specific embodiment of the complementary interrogation decoder 13 using coincidence circuits 17 in which the number of flip-flops 12 in the register 11 is equal to two.

The complementary interrogation register 11 (FIG. 1) can be arranged as a counter described, for instance, in the U.S. Pat. Nos. 3,631,350 Class 328-42 or 3,632,997 Class 235-92.

The memory operates as follows. During the recording of new associative words the code arriving to the input of one of the groups 9 (FIG. 1) of the flip-flops 8 is transmitted to the inputs of the respective decoder 6. Simultaneously, the control inputs 14 of this decoder receive the code from the outputs of the register 11. This is accomplished by the excitation of one of the address lines of the memory, i.e. the address buses 4 of every unit 1 in one matrix line, the numbers of which correspond to the binary code at the input of the respective decoder 6. Address lines corresponding to other groups 9 of the register 7 are excited in a similar manner. In addition, one of the digit buses 5 of the memory is also excited. This is the line, which includes a group of identical digit buses 5 connected to the inputs of one of the detectors 10. All the storage devices 3 in the modules 2 connected to these buses 5 have been previously driven into one state, for instance, the state of "logical 0" ("logical 1"). The storage devices 3 in the modules 2 located at the cross-points between the selected address and digit lines record the "logical 1" ("logical 0"), i.e. they store the number of excited outputs of the respective interrogation decoders 6. An associative word of $m$ bytes (in accordance with the number of groups 9 of flip-flops 8) which corresponds to $k$ descriptors (in accordance with the number of flip-flops 8 in everyone of the groups 9) is recorded on the excited digit line in $m$ storage modules (in accordance with the number of groups 9) by means of storing the states of $m$ interrogation decoders 6 (in accordance with the number of flip-flops 8 in every group 9). Another associative word may be recorded on the same digit line in case of a change of the code stored in the complementary interrogation register 11. In this case the data pertaining to other associative words recorded on this line is preserved since the access to the address storage modules does not result in information destruction. The redundancy is reduced due to the fact that a number of associative words are recorded in one digit line of the memory. The discrimination between these words in the course of interrogation is made possible due to the complementary register 11 and the complementary decoder 13. The interrogation process carried out in accordance with the codes on the registers 7 and 11 results in the excitation of one address line of the memory in every group 9 of the flip-flops 8. The presence of a "logical 1" ("logical 0") on the respective digit bus 5 of the module 2 indicates that the interrogation code recorded in the flip-flops 8 of the respective group 9 has coincided with the associative word code recorded in this module 2 on the given digit line. The appearance of a "logical 0" ("logical 1") on the bus 6 indicates that the above codes do not coincide. In case of complete coincidence of a given associative words with the code on the register 7 the inputs of respective detectors 10 will receive exactly $m$ coincidence signals while the selected detector 10 will be determined with the help of the decoder 13 when a "logical 1" signal appears at the respective output of this decoder.

The memory described above can be used in two modes of operation. In the first mode, when the complementary interrogation code is known beforehand, it is recorded in the register 11 (FIG. 11) and the interrogation of the complete associative word file is carried out in the course of a signal reference to the memory.

In the second mode the complete examination of the associative word file requires $2^l$ reference runs, where $l$ is the number of flip-flops 12 (FIG. 1) of the register 11. Here the register 11 should be designed as described in the patents mentioned above.

The present invention makes it possible to reduce several-fold the cost per bit of data storage and parallel associative processing in comparison with known associative memories due to a simpler logical structure of the device.

What is claimed is:

1. An associative memory to perform retrieval operations on descriptor data represented as multibit associative words that are sets of a given number of binary associative descriptors which comprises: a plurality of storage units arranged in a matrix to permit parallel retrieval operations on descriptor data, each storage unit including an address storage module to record, store and access descriptor data stored in said storage units; address and digit buses associated with each of said address storage modules, each of said address storage modules having a plurality of storage devices each of which is connected to one of said address and digit buses; an interrogation decoder in each storage unit to drive said address storage modules by means of said address buses; an interrogation register to receive and store the interrogation code represented by a given set of binary descriptors and having a plurality of flip-flops each having inputs and outputs, said outputs of said flip-flops being electrically connected to said inputs of said respective interrogation decoders; a plurality of detectors to indicate the position of data having the given set of binary descriptors;

a complementary interrogation decoder to drive the respective detectors and having inputs and outputs, said inputs of said detectors being connected to said digit buses, and said detectors having complementary inputs electrically connected to said outputs of said complementary interrogation decoder; and a complementary interrogation register to receive and store the complementary interrogation code represented by a complementary set of binary descriptors and having a plurality of flip-flops having inputs and outputs, said outputs of said flip-flops being connected to the respective inputs of said complementary interrogation decoder and to complementary inputs of said interrogation decoders.

2. An associative memory as defined in claim 2, wherein said matrix of storage units has lines and columns.

3. An associative memory as defined in claim 3, wherein said flip-flops of said interrogation register are arranged in groups the number of which is equal to the number of lines in said matrix.

4. An associative memory as defined in claim 3, wherein said number of detectors is equal to the number of said digit buses in one of said lines of said matrix times the number of outputs of said complementary interrogation decoder.

5. An associative memory as defined in claim 2, wherein the number of flip-flops of said interrogation register is equal to the number of binary descriptors in the interrogation code.

6. An associative memory as defined in claim 2, wherein said interrogation decoder comprises a plurality of coincidence circuits the inputs of which are connected to associated flip-flops of said interrogation register and the outputs of which are connected to associated ones of said address buses.

7. An associative memory as defined in claim 2, wherein said complementary interrogation decoder comprises a plurality of coincidence circuits the inputs of which are connected to associated flip-flops of said complementary interrogation register and the outputs of which are connected to the complementary inputs of associated ones of said detectors.

* * * * *